(12) United States Patent
Kahen

(10) Patent No.: US 6,687,274 B2
(45) Date of Patent: Feb. 3, 2004

(54) ORGANIC VERTICAL CAVITY PHASE-LOCKED LASER ARRAY DEVICE

(75) Inventor: Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/066,829

(22) Filed: Feb. 4, 2002

(65) Prior Publication Data

US 2003/0147437 A1 Aug. 7, 2003

(51) Int. Cl.$^7$ .................................................. H01S 3/14
(52) U.S. Cl. ............................. 372/39; 372/43; 372/96
(58) Field of Search .................................. 372/39, 96

(56) References Cited

U.S. PATENT DOCUMENTS

| | | | |
|---|---|---|---|
| 4,881,236 A | | 11/1989 | Brueck et al. |
| 5,052,016 A | * | 9/1991 | Mahbobzadeh et al. ...... 372/96 |
| 5,086,430 A | * | 2/1992 | Kapon et al. ................. 372/50 |
| 5,726,805 A | * | 3/1998 | Kaushik et al. ............. 359/589 |
| 6,160,828 A | * | 12/2000 | Kozlov et al. ................. 372/39 |
| 6,194,119 B1 | | 2/2001 | Wolk et al. |
| 6,392,250 B1 | * | 5/2002 | Aziz et al. .................... 257/40 |

OTHER PUBLICATIONS

Gourley P. L. et al; Coherent beams from high efficiency two-dimensional surface-emitting semiconductor laser arrays; Mar. 4, 1991; Applied Physics Letters 58 (9); pp. 890–892.*

Gourley, P. L.; Coherent beams from high efficiency two-dimensional suface-emitting semiconductor laser arrays; Mar. 4, 1991; Applied Physics Letters 58 (9); pp. 890–892.*

K. Kinoshita et al., IEEE J. Quant. Electron. QE–23, 882 (1987).

K.D. Choquette et al., Proc. IEEE 85, 1730 (1997).

C. Wilmsen et al., *Vertical–Cavity Surface–Emitting Lasers*, Cambridge University Press, Cambridge, 2001.

T. Ishigure et al., Electron. Lett. 31, 467 (1995).

P.L. Gourley et al., Appl. Phys. Lett. 54, 1209 (1989).

P.L. Gourley et al., Appl. Phys. Lett. 58, 890 (1991).

S. W. Corzine et al. IEEE J. Quant. Electr. 25, 1513, (1989).

M. Berggren et al., Nature 389, 466 (1997).

* cited by examiner

*Primary Examiner*—Quyen Leung
*Assistant Examiner*—Leith A Al-Nazer
(74) *Attorney, Agent, or Firm*—Raymond L. Owens

(57) ABSTRACT

An organic vertical cavity phase-locked laser array device includes a bottom dielectric stack reflective to light over a predetermined range of wavelengths and an organic active region for producing laser light. The device also includes a top dielectric stack spaced from the bottom dielectric stack and reflective to light over a predetermined range of wavelengths, and an etched region formed in a surface of the bottom dielectric stack to define an array of spaced laser pixels which have higher reflectance than the interpixel regions so that the array emits coherent phase-locked laser light.

9 Claims, 6 Drawing Sheets

ORGANIC VERTICAL CAVITY PHASE-LOCKED LASER ARRAY DEVICE

CROSS REFERENCE TO RELATED APPLICATIONS

Reference is made to commonly assigned U.S. patent application Ser. No. 09/832,759 filed Apr. 11, 2000 by Keith B. Kahen et al. and U.S. patent application Ser. No. 10/066,936 filed concurrently herewith entitled "Organic Vertical Cavity Lasing Devices Containing Periodic Gain Regions" by Keith B. Kahen et al.; the disclosures of which are incorporated herein by reference.

FIELD OF THE INVENTION

The present invention relates to an organic vertical cavity laser light producing device.

BACKGROUND OF THE INVENTION

Vertical cavity surface emitting lasers (VCSELs) based on inorganic semiconductors (e.g. AlGaAs) have been developed since the mid-80's (K. Kinoshita et al., IEEE J. Quant. Electron. QE-23, 882 [1987]). They have reached the point where AlGaAs-based VCSELs emitting at 850 nm are manufactured by a number of companies and have lifetimes beyond 100 years (K. D. Choquette et al., Proc. IEEE 85, 1730 [1997]). With the success of these near-infrared lasers in recent years, attention has turned to other inorganic material systems to produce VCSELs emitting in the visible wavelength range (C. Wilmsen et al., *Vertical-Cavity Surface-Emitting Lasers*, Cambridge University Press, Cambridge, 2001). There are many fruitful applications for visible lasers, such as, display, optical storage reading/writing, laser printing, and short-haul telecommunications employing plastic optical fibers (T. Ishigure et al., Electron. Lett. 31, 467 [1995]). In spite of the worldwide efforts of many industrial and academic laboratories, much work remains to be done to create viable laser diodes (either edge emitters or VCSELs) which span the visible spectrum.

In the effort to produce visible wavelength VCSELs, it would be advantageous to abandon inorganic-based systems and focus on organic-based laser systems, since organic-based gain materials can enjoy the properties of low unpumped scattering/absorption losses and high quantum efficiencies. In comparison to inorganic laser systems, organic lasers are relatively inexpensive to manufacture, can be made to emit over the entire visible range, can be scaled to arbitrary size, and most importantly, are able to emit multiple wavelengths (such as red, green, and blue) from a single chip.

The usual route for making a manufacturable laser diode system is to use electrical injection rather than optical pumping to create the necessary population inversion in the active region of the device. This is the case for inorganic systems since their optically pumped thresholds (P. L. Gourley et al., Appl. Phys. Lett. 54, 1209 [1989]) for broad-area devices are on the order of $10^4$ W/cm$^2$. Such high power densities can only be achieved by using other lasers as the pump sources, precluding that route for inorganic laser cavities. Unpumped organic laser systems have greatly reduced combined scattering and absorption losses (~0.5 cm$^{-1}$) at the lasing wavelength, especially when one employs a host-dopant combination as the active media. As a result, optically pumped power density thresholds below 1 W/cm$^2$ should be attainable, especially when a VCSEL-based microcavity design is used in order to minimize the active volume (which results in lower thresholds). The importance of power density thresholds below 1 W/cm$^2$ is that it becomes possible to optically pump the laser cavities with inexpensive, off-the-shelf, incoherent LED's.

In order to produce single-mode milliwatt output power from an organic VCSEL device, typically it is necessary to have the diameter of the emitting area be on the order of 10 µm. As a result, 1 mW of output power would require that the device be optically pumped by a source producing ~6000 W/cm$^2$ (assuming a 25% power conversion efficiency). This power density level (and pixel size) is far beyond the capabilities of LED's and, additionally, would most likely cause some degradation problems with the organic materials if they were driven cw. A path around that problem is to increase the organic laser's emitting area diameter to around 350 µm, which would reduce the pump power density level to 4 W/cm$^2$ (to produce 1 mW of output power). This power density level and pixel size is achievable by off-the-shelf 400 nm inorganic LED's. Unfortunately, broad-area laser devices having 350 µm diameter emitting areas would lead to highly multimode output and to lower power conversion efficiencies (as a result of filamentation). As a result, it is highly advantageous to produce large area organic VCSEL devices, which have good power conversion efficiencies and single-mode outputs.

SUMMARY OF THE INVENTION

It is an object of this invention to provide an organic surface emitting laser arrangement that is particularly suitable to permit phase-locked laser emission from a two-dimensional array of micron-sized organic laser pixels.

These objects are achieved by an organic vertical cavity laser array device, comprising:

a) a bottom dielectric stack reflective to light over a predetermined range of wavelengths;

b) an organic active region for producing laser light;

c) a top dielectric stack spaced from the bottom dielectric stack and reflective to light over a predetermined range of wavelengths; and d) an etched region formed in a surface of the bottom dielectric stack to define an array of spaced laser pixels which have higher reflectance than the interpixel regions so that the array emits coherent phase-locked laser light.

ADVANTAGES

It is an advantage of the present invention to provide two-dimensional organic laser array devices employing micron-sized laser pixels which can be either electrically or optically driven by large area sources and produce phase-locked laser output. The devices employ a microcavity design incorporating high reflectance dielectric stacks for both the top and bottom reflectors; and have a gain media including small-molecular weight organic material. The micron-sized laser pixels of the device are provided by modulating the reflectance of the bottom dielectric stack. The emission from the pixels is phase-locked, which enables the device to be driven by a large area source while the laser output remains single-mode (or at most two lateral modes). Combining low power density thresholds with pumping by large area sources enables the devices to be optically driven by inexpensive incoherent LED's.

DETAILED DESCRIPTION OF THE INVENTION

Figure 1:
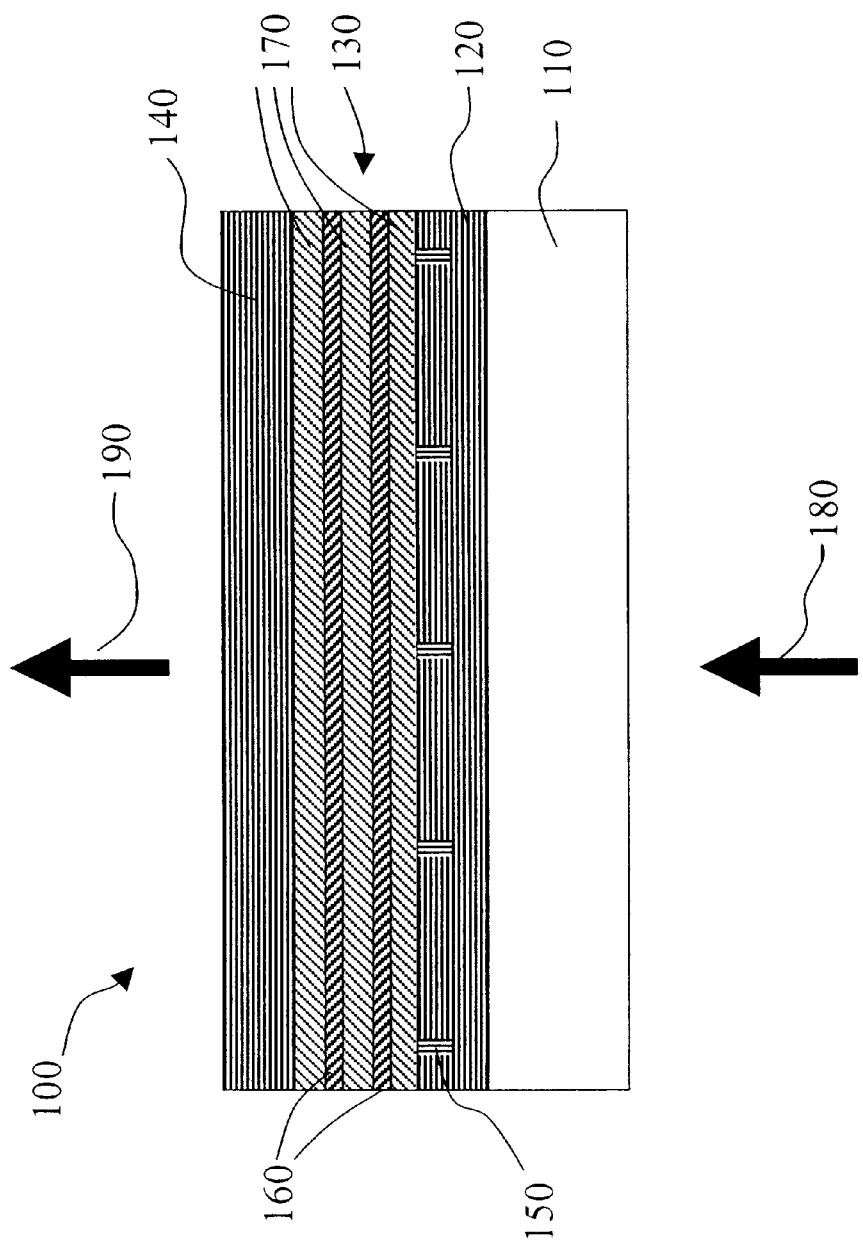
FIG. 1 shows a side view schematic of an optically pumped two-dimensional phase-locked organic vertical cavity laser array made in accordance with the present invention.

To enable a large area laser structure which emits single-mode, it is necessary to construct a two-dimensional phase-locked laser array device 100 as shown schematically in FIG. 1 and in accordance with the present invention. The substrate 110 can either be light transmissive or opaque, depending on the intended directions of optical pumping and laser emission. The substrate 110 may be transparent glass or plastic. Alternatively, opaque substrates including, but not limited to, semiconductor materials (e.g., silicon) or ceramic materials may be used in the case where optical pumping and laser emission occur from the same surface. On the substrate is deposited a bottom dielectric stack 120, which is composed of alternating high and low refractive index dielectric materials. The bottom dielectric stack 120 is designed to be reflective to laser light over a predetermined range of wavelengths. Typical high and low refractive index materials are $TiO_2$ and $SiO_2$, respectively. The bottom dielectric stack 120 is deposited by standard electron-beam deposition, where a typical deposition temperature is 240° C.

Figure 2:
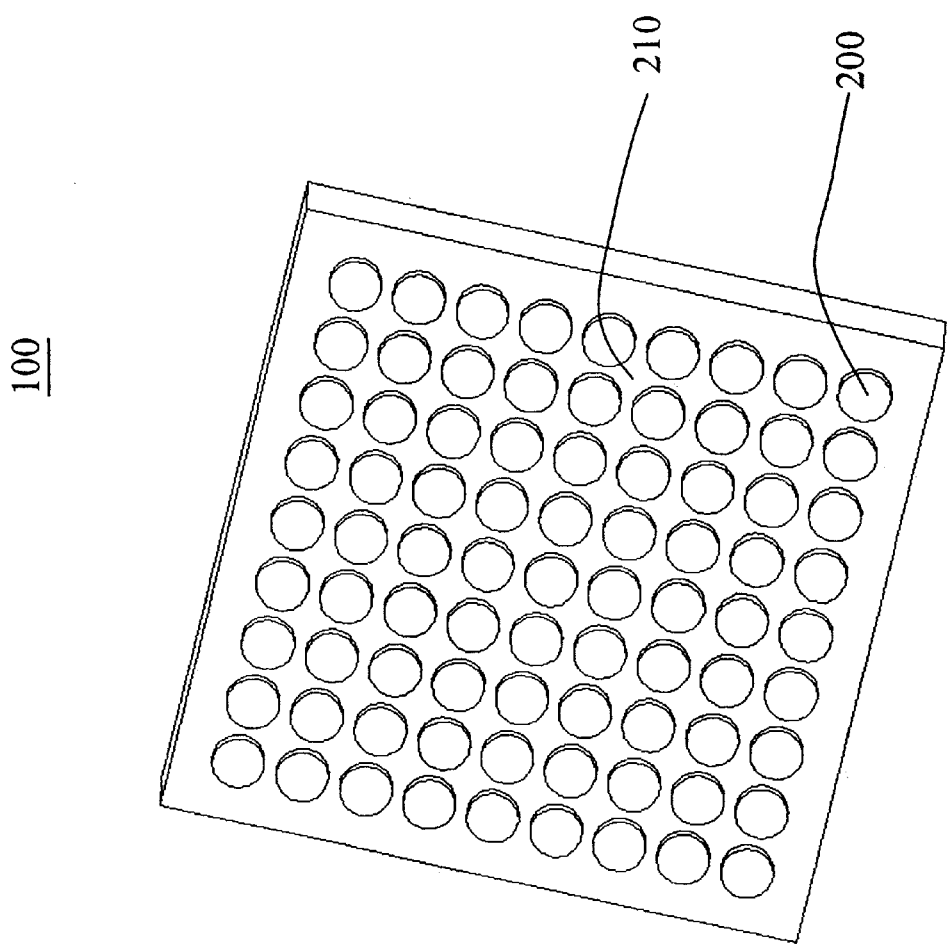
FIG. 2 shows a top view schematic of an optically pumped two-dimensional phase-locked organic vertical cavity laser array made in accordance with the present invention.

As shown in FIG. 2, in order to form a two-dimensional phase-locked laser array 100, on the surface of the VCSEL needs to be defined lasing pixels 200 separated by interpixel regions 210. To obtain phase locking, intensity and phase information must be exchanged amongst the pixels. This is best obtained by weakly confining the laser emissions to the pixel regions by either small amounts of built-in index or gain guiding. As applied to two-dimensional inorganic laser arrays, a fruitful route for obtaining this weak confinement was to modulate the reflectance of the top dielectric stack by either adding metal (E. Kapon and M. Orenstein, U.S. Pat. No. 5,086,430) or by deep etching into the top dielectric stack (P. L. Gourley et al., Appl. Phys. Lett. 58, 890 [1991]). In both inorganic laser array cases, the laser pixels were on the order of 3–5 μm wide (so as to enable single-mode action) and the interpixel spacing was 1–2 μm. Applying these results to organic laser systems requires some care since it is very difficult to perform micron-scale patterning on the laser structure once the organic layers have been deposited. As a result, in the preferred embodiment the reflectance modulation was affected by patterning and forming an etched region 150 in the bottom dielectric stack 120, using standard photolithographic and etching techniques, thus forming a two-dimensional array of circular pillars on the surface of the bottom dielectric stack. In the preferred embodiment the shape of the laser pixels was circular; however, other pixel shapes are possible, such as, rectangular. The interpixel spacing is in the range of 0.25 to 4 μm. Phase-locked array operation also occurs for larger interpixel spacings; however, it leads to inefficient usage of the optical-pumping energy. Following the inorganic lead and etching deeply into the bottom dielectric stack 120 in order to significantly lower the interpixel reflectivity is not a preferred route since it would lead to significant modulation of the active region position. A preferred method is to make a shallow etch from 50 to 400 nm deep to form etched region 150, and make use of the condition that lasing only occurs for wavelengths whose round-trip phase is an integer multiple of $2\pi$. As an example for red laser arrays, the lasing wavelength was chosen to be 660 nm. By removing odd multiples of layers (e.g., one $SiO_2$ layers or 2 $SiO_2$ layers and a $TiO_2$ layer) from the bottom dielectric stack 120, it was calculated (S. W. Corzine et al., IEEE J. Quant. Electron. 25, 1513 [1989]) that the lasing wavelength in the interpixel regions 210 would be pushed as far as possible from 660 nm (~610 and 710 nm). In doing this, it was found that the lasing and spontaneous emission signals in the 710 nm region are very small. Further, it was determined that by etching a few tens of nanometers deeper into the next $TiO_2$ layer, the short wavelength resonance condition would be pushed into the 590 nm wavelength region. In this wavelength region the dielectric stack reflectivity is significantly lower (which would impede any unwanted lasing) and the gain media's fluorescence strength is much reduced (which would impede any unwanted spontaneous emission). Hence, lasing action is prevented and spontaneous emission is significantly reduced in the interpixel regions 210 by etching just beyond a couple of odd multiples of layers in the bottom dielectric stack 120. The end result of the formation of etched region 150 is that the laser emission is weakly confined to the laser pixels 200, no lasing originates from the interpixel regions 210, and coherent phase-locked laser light is emitted by the array 100.

The organic active region 130 is deposited over the etched bottom dielectric stack 120. The active region can be composed of either small-molecular weight organic material or conjugated polymeric organic material. The small-molecular weight organic material is typically deposited by high-vacuum ($10^{-6}$ Torr) thermal evaporation, while the conjugated polymers are usually formed by spin casting. FIG. 1 shows that the organic active region 130 is not a bulk layer but a multilayer composite. Following the suggestions of Brueck et al. (U.S. Pat. No. 4,881,236) for inorganic lasers, the organic active region 130 contains one or more periodic gain regions 160, which are separated by organic spacer layers 170. The thickness of the periodic gain regions 160 is typically less than 50 nm, with a preferred thickness of 10 to 30 nm. The thicknesses of the organic spacer layers 170 are chosen such that the periodic gain region(s) is aligned with the antinodes of the laser cavity's standing electric-field. Employing periodic gain region(s) in the active region results in larger power conversion efficiencies and a large reduction in the unwanted spontaneous emission. In summary, the active region 130 includes one or more periodic gain regions 160 and organic spacer layers 170 disposed on either side of the periodic gain region(s) and arranged so that the periodic gain region(s) is aligned with the antinodes of the device's standing wave electromagnetic field.

The periodic gain region(s) 160 is composed of either small-molecular weight organic material or polymeric organic material, which fluoresce with a high quantum efficiency. Typical polymeric materials are, for example, polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein. In this embodiment, it is preferred to use small-molecular weight organic material since a host-dopant combination can be employed which results (via the mechanism of Forster energy transfer) in a very small unpumped band-to-band absorption coefficient, <1 cm$^{-1}$, for the gain media at the lasing wavelength (M. Berggren et al., Nature 389, 466 [1997]). An example of a useful host-dopant combination for red-emitting lasers is aluminum tris(8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for emission in other wavelength regions, such as, in the green and blue. For the organic spacer layer 170 it is preferred to use a material which is highly transparent to both the laser emission 190 and the pump-beam 180. In this embodiment 1,1-Bis-(4-bis(4-methyl-phenyl)-amino-phenyl)-cyclohexane (TAPC) was chosen as the spacer material, since it has very low absorption throughout the visible and near UV spectrum and its index of refraction is slightly lower than that of most organic host materials. This refractive index difference is useful since it helps in maximizing the overlap between the standing electric-field antinodes and the periodic gain region(s) 160.

Following the active region 130 is deposited the top dielectric stack 140. The top dielectric stack 140 is spaced from the bottom dielectric stack and reflective to light over a predetermined range of wavelengths. Its composition is analogous to that of the bottom dielectric stack 120. Since the top dielectric stack 140 is deposited over an organic-based active region, its deposition temperature must be kept low in order to avoid melting the organics. As a result, a typical deposition temperature for the top dielectric stack 140 is 70° C. In order to obtain good lasing performance, it is preferred that the peak reflectivities of the top 140 and bottom 120 dielectric stacks be greater than 99%, where smaller values result in larger lasing linewidths.

The laser pixels 200 in FIG. 2 are arranged in a square two-dimensional array, which under phase-locked operation results in each element being 180 degrees out of phase with its four nearest neighbors (E. Kapon and M. Orenstein, U.S. Pat. No. 5,086,430). Other arrangements of the laser pixels 200 are allowed, such as linear arrays or other two-dimensional periodic arrangements of the pixels. However, as shown by Kapon et al. (U.S. Pat. No. 5,086,430), close-packed two-dimensional arrangements (such as a hexagonal lattice array) result in more complicated phase relationships between the neighboring pixels.

The two-dimensional phase-locked laser array device 100 is optically driven by an incident pump-beam source 180 and emits phase-locked laser emission 190. Depending on the lasing power density threshold of the organic laser cavity, the pump-beam can be either focused laser light or incoherent LED light. FIG. 1 shows laser emission 190 through the top dielectric stack 140. Alternatively, the laser structure could be optically pumped through the top dielectric stack 140 with the laser emission through the substrate 110 by proper design of the dielectric stack reflectance properties. In the case of an opaque (e.g., silicon) substrate, both optical pumping and laser emission occurs through the top dielectric stack 140. The operation of the optically pumped organic laser array device occurs by the following means. The pump-beam 180 transmits through the substrate 110 and the bottom dielectric stack 120, and is absorbed by the periodic gain region(s) 160, wherein some fraction of the pump-beam energy is re-emitted as longer wavelength laser light. When the pump-beam 180 enters through the substrate 110, to ensure that the laser output 190 mainly exits through the top dielectric stack 140, it is necessary to choose the bottom dielectric stack peak reflectance to be greater than the top dielectric stack peak reflectance. To improve the power conversion efficiency of the device, it is common practice to add additional dielectric layers to both dielectric stacks, such that, the bottom dielectric stack 120 is highly transmissive to the pump-beam 180 and the top dielectric stack 140 is highly reflective to the pump-beam. The laser light is emitted by the laser pixels 200 and, as a result of the weak confinement, both phase and intensity information is exchanged amongst the pixels. As a result, coherent phase-locked laser emission occurs through the top dielectric stack 140.

In an alternative embodiment of the present invention, the top dielectric stack 140 is replaced by the deposition of a reflective metal mirror layer. Typical metals are silver or aluminum, which have reflectivities in excess of 90%. It is preferred that the metals be deposited by vacuum thermal evaporation to avoid causing damage to the underlying organic layers. In this alternative embodiment, both the pump-beam 180 and the laser emission 190 would proceed through the substrate 110.

The following examples are presented as further understandings of the present invention and are not to be construed as limitations thereon.

EXAMPLE 1

In order to determine the lasing characteristics of the two-dimensional phase-locked laser arrays of FIGS. 1 and 2, laser structures were grown on pre-cleaned 6-inch Si substrates. Since the Si substrates are opaque, both the pump-beam 180 and the laser emission 190 occur through the top side of the device (and though the top dielectric stack 140). Over the substrate was deposited, by conventional electron-beam deposition, the bottom dielectric stack 120, which was composed of alternating high and low refractive index layers of $TiO_2$ and $SiO_2$, respectively. The resulting dielectric mirror had a measured peak reflectance of ~99.95% at 660 nm. Next, standard photolithographic techniques were used to pattern the bottom dielectric stack 120 so as to create a two-dimensional square array of 5 μm circular pillars, with an edge-to-edge separation of 1 μm. A conventional Fluorine-based dry etchant was used to etch to a depth of 330 nm in the interpixel regions 210. On the top of the bottom dielectric stack 120 was deposited, by high vacuum thermal evaporation, the organic active region 130, where in order was grown 168 nm of TAPC, 50 nm of Alq with 1% DCJTB, and 172 nm of TAPC. Lastly, the top dielectric stack 140 was deposited by low temperature electron-beam deposition, such that the measured temperature of the Si substrate was kept below 72° C. It was composed of alternating high and low refractive index layers of $TiO_2$ and $SiO_2$, respectively. The resulting dielectric mirror had a measured peak reflectance of ~99.9% at 660 nm.

To test the devices for both their spectral and power characteristics, the laser cavities were optically pumped from the top side at approximately 30° from the normal using the 404 nm output from a 5 mW Nichia laser diode. The pump laser produced 50 nsec laser pulses at a repetition rate of 5 KHz. The pump-beam intensity was adjusted by the combination of two neutral density wheels and it was focused onto the laser cavity surface using a 1000 mm lens. The resulting measured pump-beam spot size on the device surface was elliptical with dimensions of 177×243 μm. The laser output 190 from the cavity was focused on the entrance slit of a Spex double monochrometer (0.22 m) by the combination of a 50 mm f2 lens and a 100 mm f4 lens nearest the slit (resulting in a 2× magnification of the laser's near-field image). The resolution of the monochrometer is approximately 0.45 nm; its output was detected by a cooled Hamamatsu photomultiplier tube.

Figure 3:
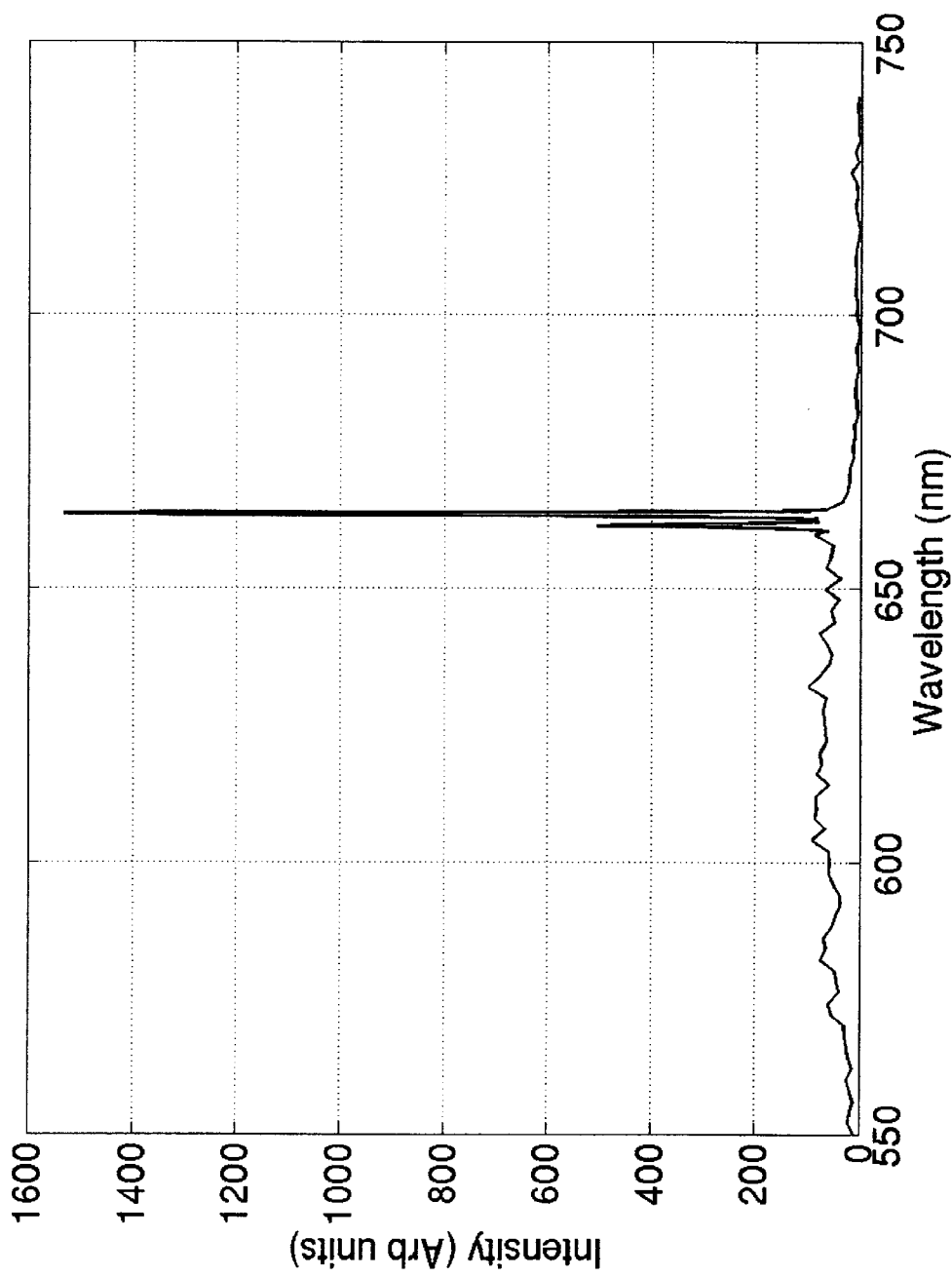
FIG. 3 shows a graph of intensity vs. wavelength and depicts the laser emission spectra for an optically pumped two-dimensional phase-locked organic vertical cavity laser array.

FIG. 3 shows the laser spectrum collected by the 0.25 NA (numerical aperture) lens. The sample has two laser peaks, the $TEM_{0,0}$ at 663.7 nm and the $TEM_{1,0}$ at 661.6 nm, whose full-width at half-maximum (FWHM) are 0.55 and 0.69 nm, respectively. On the long wavelength side of the $TEM_{0,0}$ peak, the spontaneous emission signal is within the noise of the spectrometer. On the short wavelength side of the $TEM_{1,0}$ peak, the spontaneous emission signal is larger, with its peak intensity being a factor of 21 smaller than the $TEM_{0,0}$ lasing peak intensity. This spontaneous emission is emitted from the interpixel regions 210 of the array. In a related laser array device, where the edge-to-edge pixel separation was lowered to 0.6 μm, the spontaneous emission peak signal was down by a factor of 57 from the intensity of the $TEM_{0,0}$ laser peak.

EXAMPLE 2

Figure 4:
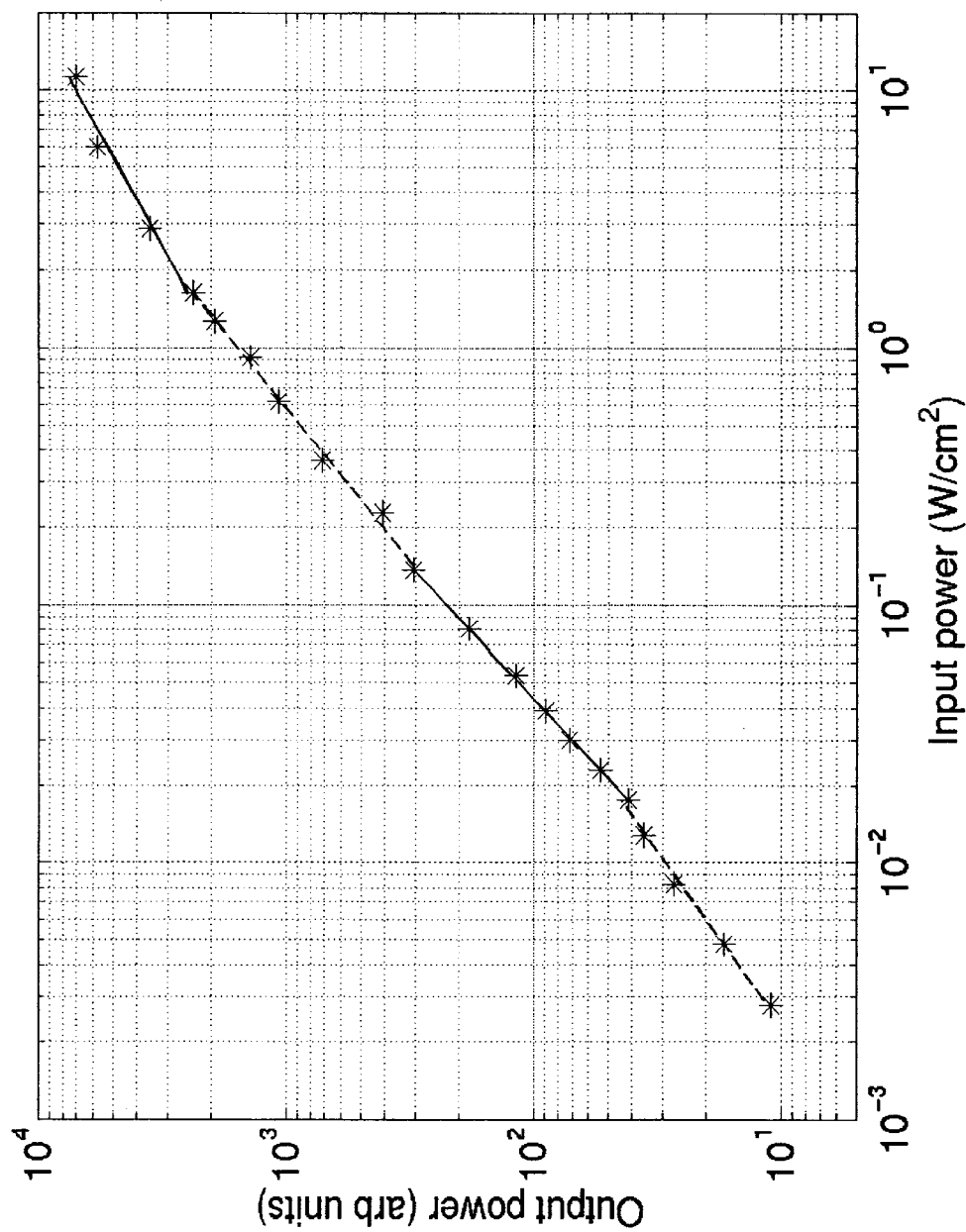
FIG. 4 is graph which depicts optical output power vs. input power for a two-dimensional phase-locked organic vertical cavity laser array.
Figure 5:
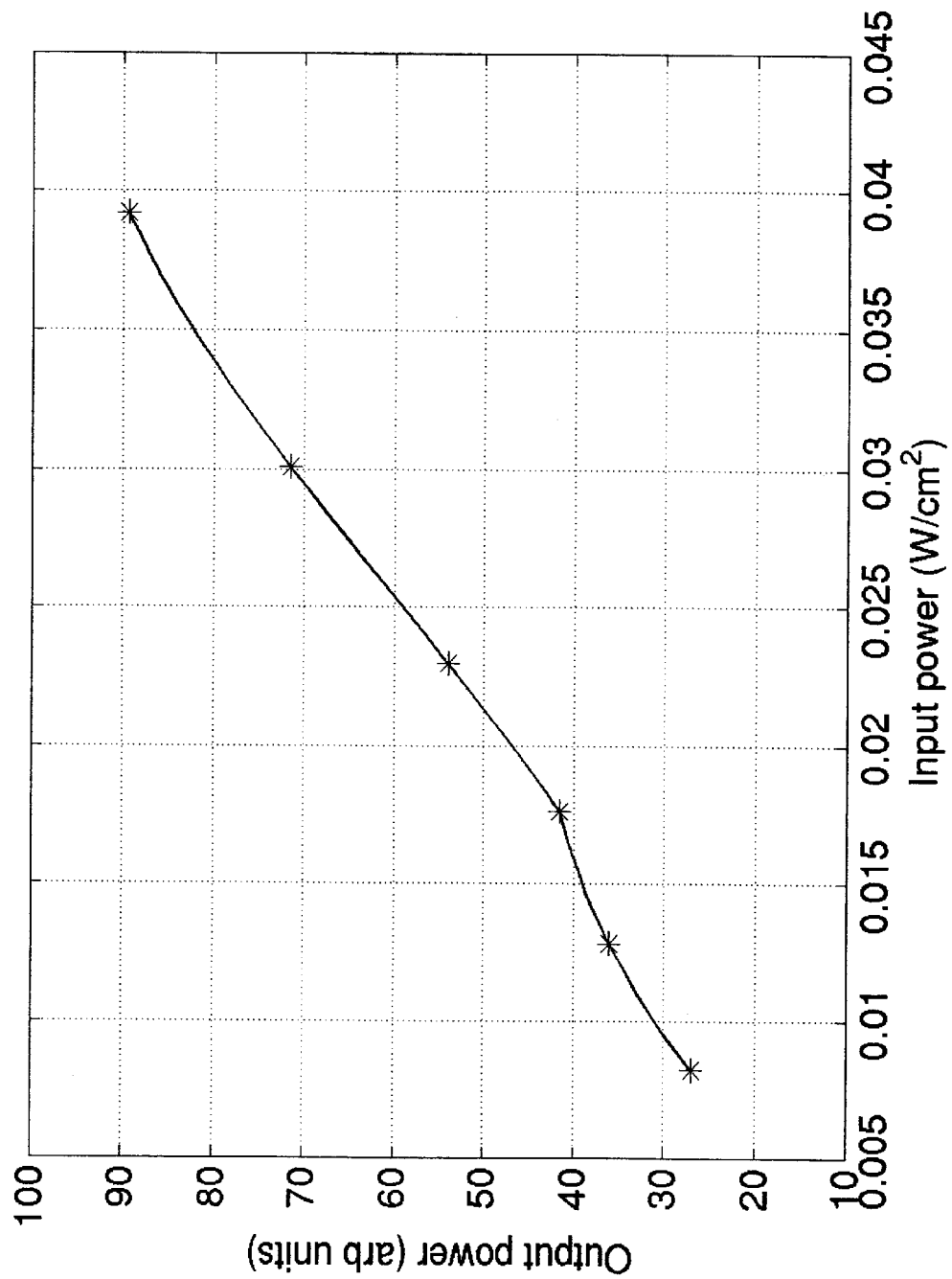
FIG. 5 is a graph similar to FIG. 4 of the pump power in vs. the laser power out near the lasing transition region for a two-dimensional phase-locked organic vertical cavity laser array.

The laser array structure was analogous to that described with reference to Example 1, except the active region 130 organic layer thicknesses were 186 nm of TAPC, 20 nm of Alq with 1% DCJTB, and 186 nm of TAPC, while the etch depth in the interpixel region 210 was 110 nm. A plot of the pump-beam power in versus laser power output is given in FIG. 4. As can be seen from the figure, the VCSEL array has a power density threshold of ~0.02 W/cm². This result is two orders of magnitude lower than our previous result for small-diameter (2.5 μm) broad-area devices and three orders of magnitude better than that reported in the organic laser literature (Berggren et al., Nature 389, 466 [1997]). The large drop in threshold relative to that for the small-diameter broad-area device is most likely due to less localized heating and to much reduced diffraction losses. The figure shows that following the sharp rise in slope after the lasing threshold, the slope once more begins to fall-off for input power densities an order of magnitude above lasing. This exact same trend occurred for the broad-area devices; consequently, the effect is not specific to the arrays but generic of organic VCSELs. To get a close-up view of the lasing transition region, the laser output curve was replotted in FIG. 5 on a linear scale. The figure shows that the array has a very sharp turn-on.

Figure 6:
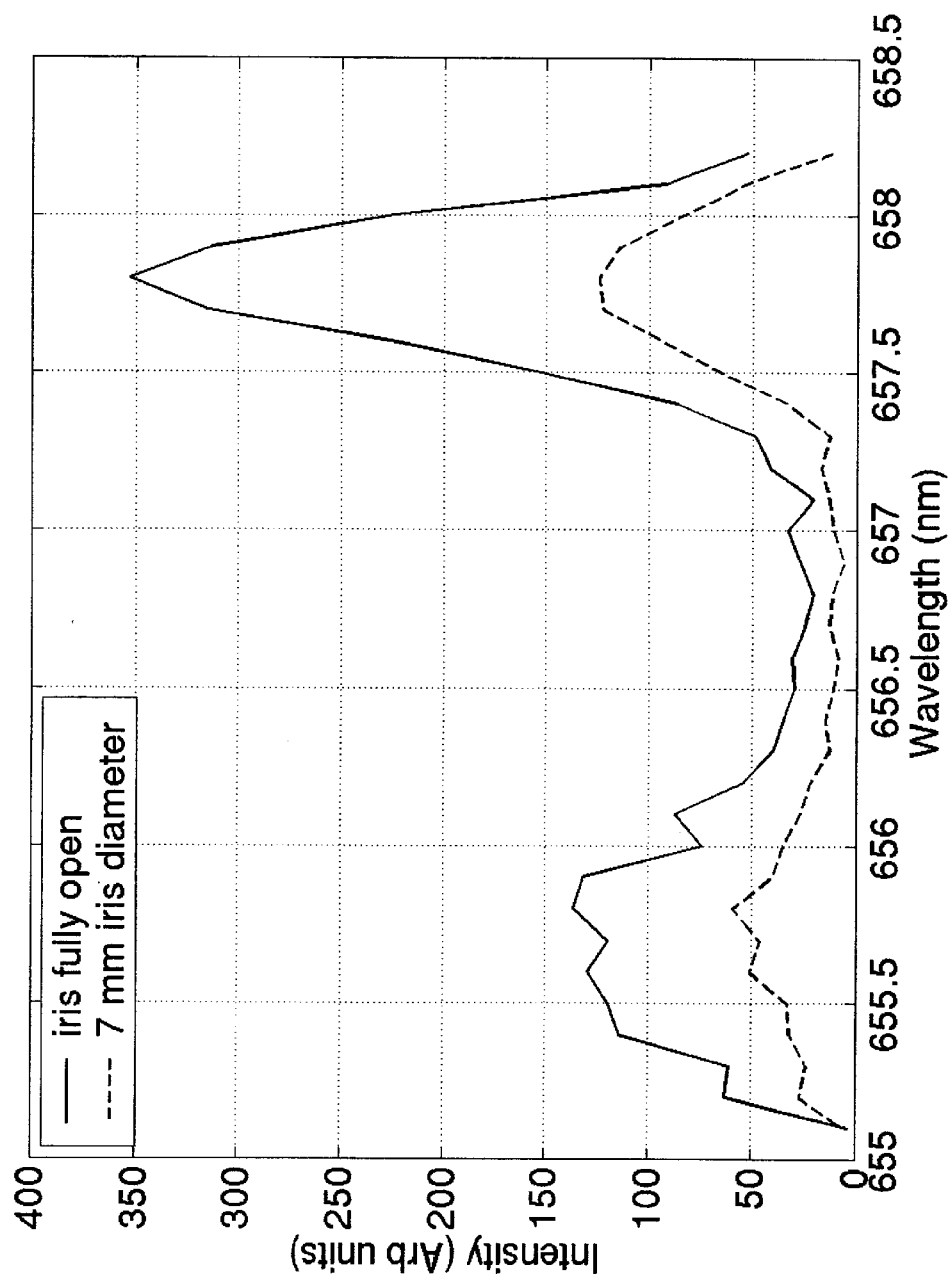
FIG. 6 shows a graph of the impact of closing down the lens aperture on the laser spectrum of a two-dimensional phase-locked organic vertical cavity laser array.

FIG. 6 presents evidence that the laser emission from the array is phase-locked. To obtain these spectra an aperture was placed following the f2 collimating lens. The figure compares the array emission with the aperture wide open and with it closed down to 7 mm. This measurement was performed since two-dimensional phase-locked square arrays emit four lobes of laser emission such that there is a null along the optic axis (P. L. Gourley et. al., Appl. Phys. Lett. 58, 890 [1991]). FIG. 6 shows that the array emission is lowered by a factor of 3 by closing it down to 7 mm. Correspondingly, closing the aperture down to 7 mm had no impact on the peak intensity of the broad-area (2.5 μm diameter) laser's $TEM_{0,0}$ peak. Additionally, given the size of the array imaged by the pump-beam (about a 210 μm diameter), an equivalent coherent broad-area laser would have an angular spread of ~0.2 degrees or have a beam spread at the 50 mm collimating lens of ~0.2 mm (as a result suffer no attenuation due to a 7 mm aperture).

A final indication of phase-locking comes from the effect of the narrowing of the laser linewidths as the array size gets larger (P. L. Gourley et. al., Appl. Phys. Lett. 58, 890 [1991]). In many instances the same VCSEL array was imaged with both a 150 mm lens and a 300 mm lens, where the measured pump-beam spot sizes were 21×29 μm and 52×73 μm, respectively. In the former case the $TEM_{0,0}$ mode had a FWHM of ~0.54 nm, while in the large spot size case the FWHM narrowed to ~0.47 nm. Additional evidence comes from the narrowing of the linewidth as arrays of different interpixel spacings were tested. For instance, in the same VCSEL sample as the interpixel spacing shrunk from 10 μm to 1 μm, the laser linewidths of the two modes fell from 0.54 and 1.04 nm to 0.45 and 0.86 nm, respectively.

The invention has been described in detail with particular reference to certain preferred embodiments thereof, but it will be understood that variations and modifications can be effected within the spirit and scope of the invention.

PARTS LIST

100 laser array device
110 substrate
120 bottom dielectric stack
130 organic active region
140 top dielectric stack
150 etched region
160 periodic gain region
170 organic spacer layer
180 pump-beam
190 laser emission
200 laser pixel
210 interpixel region

What is claimed is:

1. An organic vertical cavity laser array device, comprising:
   a) a bottom dielectric stack reflective to light over a predetermined range of wavelengths;
   b) an organic active region for producing laser light;
   c) a top dielectric stack spaced from the bottom dielectric stack and reflective to light over a predetermined range of wavelengths;
   d) an etched region formed in a surface of the bottom dielectric stack to define an array of spaced laser pixels which have higher reflectance then the interpixel regions so that the array emits coherent phase-locked laser light; and
   e) wherein the active region includes one or more periodic gain region(s) and organic spacer layers disposed on either side of the periodic gain region(s) and arranged so that the periodic gain region(s) is aligned with the antinodes of the device's standing wave electromagnetic field.

2. The organic vertical cavity laser array device of claim 1 wherein pump-beam light is transmitted and introduced into the organic active region through at least one of the dielectric stacks.

3. The organic vertical cavity laser array device of claim 1 wherein the organic active region is a combination of a host material and a dopant and the spacer layer is substantially transparent to pump-beam light and laser light.

4. The organic vertical cavity laser array device of claim 3 wherein the host material is aluminum tris(8-hydroxyquinoline), the dopant is [4-(dicyanomethylene)-2-t-butyl-6-(1,1,7,7-tetramethyljulolidyl-9-enyl)-4H-pyran], and the organic spacer layer is 1,1-Bis-(4-bis(4-methyl-phenyl)-amino-phenyl)-cyclohexane.

5. The organic vertical cavity laser array device of claim 1 wherein the spacing between pixels is in the range of 0.25 to 4 microns.

6. The organic vertical cavity laser array device of claim 1 wherein the organic active region includes polymeric materials.

7. The organic vertical cavity laser array device of claim 1 wherein the pixels are arranged in a linear array.

8. The organic vertical cavity laser array device of claim 1 wherein the pixels are arranged in a two-dimensional square array.

9. An organic vertical cavity laser array device, comprising:
   a) a first dielectric stack reflective to light over a predetermined range of wavelengths;
   b) an organic active region for producing laser light;
   c) a metallic layer spaced from the first dielectric stack and reflective to light; and
   d) an etched region formed in a surface of the first dielectric stack to define an array of spaced laser pixels which have higher reflectance than the interpixel regions so that the array emits coherent phase-locked laser light.

* * * * *